United States Patent
Sun et al.

(10) Patent No.: US 9,766,542 B2
(45) Date of Patent: Sep. 19, 2017

(54) NEGATIVE CHEMICALLY-AMPLIFIED PHOTORESIST AND IMAGING METHOD THEREOF

(71) Applicant: Kempur Microelectronics, Inc., Beijing (CN)

(72) Inventors: Jia Sun, Beijing (CN); Xin Chen, Beijing (CN); Roger Sinta, Beijing (CN); Bing Li, Beijing (CN); Cuimei Diao, Beijing (CN); Haibo Li, Beijing (CN); Xiantao Han, Beijing (CN)

(73) Assignee: KEMPUR MICROELECTRONICS, INC., Beijing (CN)

( * ) Notice: Subject to any disclaimer, the term of this patent is extended or adjusted under 35 U.S.C. 154(b) by 0 days.

(21) Appl. No.: 14/902,433

(22) PCT Filed: Aug. 21, 2013

(86) PCT No.: PCT/CN2013/081971
§ 371 (c)(1),
(2) Date: Dec. 31, 2015

(87) PCT Pub. No.: WO2015/000213
PCT Pub. Date: Jan. 8, 2015

(65) Prior Publication Data
US 2016/0223907 A1    Aug. 4, 2016

(30) Foreign Application Priority Data

Jul. 3, 2013    (CN) .......................... 2013 1 0277171

(51) Int. Cl.
| | |
|---|---|
| *G03F 7/038* | (2006.01) |
| *G03F 7/004* | (2006.01) |
| *G03F 7/30* | (2006.01) |
| *G03F 7/38* | (2006.01) |
| *G03F 7/32* | (2006.01) |
| *G03F 7/40* | (2006.01) |
| *G03F 7/20* | (2006.01) |
| *G03F 7/16* | (2006.01) |

(52) U.S. Cl.
CPC .......... *G03F 7/0382* (2013.01); *G03F 7/0045* (2013.01); *G03F 7/0046* (2013.01); *G03F 7/168* (2013.01); *G03F 7/20* (2013.01); *G03F 7/30* (2013.01); *G03F 7/322* (2013.01); *G03F 7/38* (2013.01); *G03F 7/40* (2013.01)

(58) Field of Classification Search
None
See application file for complete search history.

(56) References Cited

U.S. PATENT DOCUMENTS

| | | | | |
|---|---|---|---|---|
| 5,296,332 A | * | 3/1994 | Sachdev | G03F 7/0045 430/270.1 |
| 6,117,604 A | * | 9/2000 | Saito | C09B 47/08 430/56 |
| 6,153,349 A | * | 11/2000 | Ichikawa | G03F 7/039 430/170 |
| 6,576,394 B1 | | 6/2003 | Xu et al. | |
| 7,595,143 B2 | | 9/2009 | Park et al. | |
| 2003/0022095 A1 | * | 1/2003 | Kai | G03F 7/0045 430/170 |
| 2003/0165776 A1 | * | 9/2003 | Yasunami | G03F 7/0382 430/280.1 |
| 2010/0233603 A1 | * | 9/2010 | Hikosaka | C08G 64/085 430/70 |
| 2011/0159253 A1 | * | 6/2011 | Kang | G03F 7/09 428/195.1 |
| 2013/0113086 A1 | * | 5/2013 | Bai | B81C 1/00611 257/632 |

FOREIGN PATENT DOCUMENTS

| | | |
|---|---|---|
| CN | 1436324 A | 8/2003 |
| CN | 1936705 A | 3/2007 |

OTHER PUBLICATIONS

International Search Report for corresponding PCT Application No. PCT/CN2013/081971 dated Mar. 27, 2014.

\* cited by examiner

*Primary Examiner* — Sin Lee
(74) *Attorney, Agent, or Firm* — Caesar Rivise, PC

(57) ABSTRACT

Provided are a novel negative chemically-amplified photoresist and an imaging method thereof. The negative chemically-amplified photoresist comprises phenol resin, a photo-acid generator, a cross-linking agent, an alkaline additive, a sensitizing agent and a photoresist solvent, wherein the phenol resin is a host material of the novel negative chemically-amplified photoresist; the photo-acid generator is capable of generating an acid with a certain strength under illumination; and the cross-linking agent can undergo a condensation reaction with a phenolic hydroxyl group or an ortho-/para-hydroxymethyl functional group. The imaging method of the novel negative chemically-amplified photoresist comprises coating, baking, exposure, baking, developing and other steps. The chemically-amplified negative photoresist of the present invention can improve the resolution and photospeed of photoresists effectively. And meanwhile, the chemically-amplified negative photoresist, for which the ancillaries used is the same as that used for positive photoresists, is applicable in the fields of manufacture of top-grade integrated circuits, flat panel displays and LED chips.

18 Claims, No Drawings

NEGATIVE CHEMICALLY-AMPLIFIED PHOTORESIST AND IMAGING METHOD THEREOF

FIELD OF THE INVENTION

The present invention relates to field of the microelectronics device manufacturing, in particular relating to a novel negative chemically-amplified photoresist and imaging method thereof.

PRIOR ART

In the field of the microelectronics device manufacturing, photoresist is a key functional material transferring pattern from mask plate to substrate. Its application process is as follows:

first, a photoresist is coated on a substrate (typically using spin coating); and solvent of the photoresist is removed by pre-bake; then, a light source with a specific wavelength is irradiated onto the photoresists through a mask plate, and a chemical reaction happens in exposed area, and it changes rate of dissolution of the photoresists in developing;

then corresponding pattern will be obtained by the developer; then by etching, ion implantation, metal deposition or other processes, the pattern will be transferred to the substrate unprotected by the photoresists; finally the photoresist is removed by stripper, and pattern transfer process is completed.

Generally, according to different chemical mechanisms of action, the photoresists can be classified into two categories of a positive photoresist and a negative photoresist. Positive photoresist refers to that unexposed area of which is insoluble in the developer and exposed area of which is soluble in the developer, and as a result, the base material covered under the unexposed photoresist is protected from impacting of the later process, and the exposed photoresist is dissolved in developer so that the base material covered under the exposed photoresist is exposed, which facilitates processing. While for negative photoresist, after film is formed, unexposed portions of the film could be dissolved in the developer and washed out, and exposed portions of the film become insoluble in the developer left on the substrate.

Generally, action principle of negative photoresist is as follows: after exposure, photosensitizer in exposure area generates new substances that can be capable of initiating polymerization or cross-linking of resin, and after polymerization or cross-linking, the resin is different from that in unexposed areas and becomes insoluble in the developer, leaving pattern on the base material opposite to the mask plate. Therefore, the negative photoresist composition generally comprises resin including reactivity functional groups, photosensitizer, solvents and additives. Based on the principle of photochemical amplification, the negative photoresist contains photoacid generator which releases acid after exposure and can catalyze cross-linking agent interacting with resin to undergo cross-linking.

Existing negative photoresist generally consists of cyclized rubber and biazido compounds, and its resolution is low and cannot satisfy needs of advanced lithography process; this system also suffers swelling phenomenon from the developer to the exposure area resulting in the situations of irregular line edge, coarse lines and poor fineness, and further reducing the resolution of the photoresists; on the other hand, a matching developer generally contains toxic substances such as xylene, etc., which is potentially dangerous for safety of operator and protection of the environment.

Chinese Patent No. ZL01811264.1 discloses a negative effect chemically amplified photoresist composition. The composition comprises a phenolic resin having ring bonded hydroxyl groups and acting as film-forming polymer adhesive, a combination of at least two chemically dissimilar crosslinking agents, and a compound that generates acid upon exposure to imaging radiation (that is a photoacid generator). The composition can be developed in an alkaline developer, but for the composition, resolution is low, and swelling also happens in the developer.

Therefore, novel negative photoresist having higher resolution and photospeed and being more environmentally friendly is needed in manufacturing of microelectronics device, so that the line edge of image is much straighter, and pattern is much clearer, and meanwhile, environmental pollution is also reduced.

DESCRIPTION OF PRESENT INVENTION

In order to solve mentioned problems of the prior arts, such as the resolution of negative photoresist is low, harm of the corresponding developer is large, and swelling may happen in development. The present invention provides a novel negative chemically-amplified photoresist, which uses a resin having molecular weight of thousands or even smaller. In the present invention, degree of cross-linking could be controlled by controlling amount of cross-linking agent, and the photoresist has higher resolution and photospeed. The photoresit of the invention especially applies to UV exposure equipment and technology. The photoresist can be used with ordinary TMAH developer, and it has lower requirements to the operation of the personnel and the production line machine, and it is more friendly to the environment. With the negative photoresist, higher resolution and photospeed, and patterns having straighter line edge can be got.

The present invention provides a novel negative chemically-amplified photoresist, comprising:

a) phenol resin, a host material capable of forming a photoresist film, and the film-forming resin has high transparency under ultraviolet light;

b) a photoacid generator, which is capable of generating acid with a certain strength under illumination, and the crosslinking speed of the film-forming resin, which is embodied in exposure speed of the lithography process, can be controlled by controlling concentration of the acid;

c) a cross-linking agent, with the catalysis of acid produced by the photoacid generator, the cross-linking agent can undergo a condensation reaction with phenolic hydroxyl group or ortho-/para-hydroxymethyl functional group of the film-forming resin to form methine bonds and a little of ether bonds, so that the film-forming resin forms a mesh cross-linking structure;

d) an alkaline additive, the alkaline additive is used to enhance stability and to mitigate impact from environmental alkali on the acid generated by the photoacid generator under illumination, while it also can control diffusion of the acid and improve dissolution rate contrast of exposed and un-exposed areas;

e) a sensitizing agent, some dyes have sensitization for onium salt photoacid generator, and could enhance sensibility under ultraviolet source exposure, so that the photospeed of the photoresist systems could be improved;

f) a photoresist solvent, the mentioned materials in a)-e) could be dissolved well in the photoresist solvent. The photoresist solvent has good chemical stability in the condition of heating, and it has suitable boiling point and can be timely volatile in high temperature hardening process, and enables the liquid prepared by mixing a)-e) substances to have a relatively small surface tension, which is in favor of photoresist spreading on surface of semiconductor base.

Preferably, mass ratio of said phenol resin, photo-acid generator, cross-linking agent, alkaline additive, sensitizing agent and photoresist solvent is 23-26: 1-4: 28-32: 1-2: 0-2: 65-75.

More preferably, the mass ratio of said phenol resin, photo-acid generator, cross-linking agent, alkaline additive, sensitizing agent and photoresist solvent is 25.35: 1.5: 30: 1.5: 1.5: 70.

More preferably, the mass ratio of said phenol resin, photo-acid generator, cross-linking agent, alkaline additive, sensitizing agent and photoresist solvent is 23.85: 3.0: 30: 1.5: 1.5: 70.

In any of the above schemes, preferably, said phenol resin is linear polymer material obtained by condensation polymerization of phenolic polymer or condensation polymerization of phenolic polymer with aldehydes.

In any of the above schemes, preferably, said phenol resin is poly (p-hydroxystyrene) resin and/or linear novolac resin.

In any of the above schemes, preferably, said phenols is any one or more selected from a group consisting of phenol, cresol, xylenol, resorcinol, alkylphenol and phenol aralkyl; said aldehydes is any one or more selected from a group consisting of formaldehyde, acetaldehyde and furfural.

In any of the above schemes, preferably, said photoacid generator is any one or more selected from a group consisting of iodonium salts, sulfonium salts and heterocyclic acid generators; general formulas of said iodonium salts, sulfonium salts and heterocyclic acid generators are respectively following (1), (2) and (3):

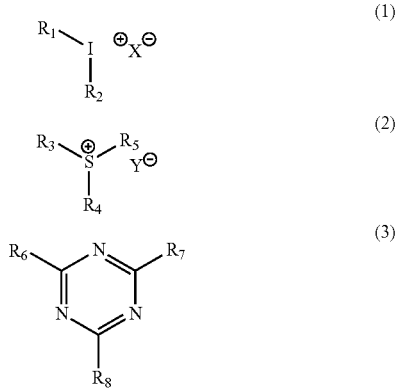

wherein, $R_1$, $R_2$, $R_3$, $R_4$, $R_5$, $R_6$, $R_7$ and $R_8$ are hydrocarbons ($C_nH_{n+1}$, n=1-6), or benzene and benzene derivatives, or hydrocarbons containing halogen; X and Y are $BF_4^-$, $ClO_4^-$, $PF_6^-$, $AsF_6^-$, $SbF_6^-$ and other non-nucleophilic anions.

In any of the above schemes, preferably, said halogen is Cl and/or Br. In any of the above schemes, preferably, said cross-linking agent is heterocyclic compound containing ether bond.

In any of the above schemes, preferably, said ether bond connects to hydrocarbon chain of 1-6 carbon atoms, and/or hydrocarbons containing halogen (Cl, Br), and/or benzene and benzene derivatives, and the ether bond can undergo a cross-linking reaction with a film-forming resin.

In any of the above schemes, preferably, said alkaline additive is organic alkaline substance.

More preferably, said organic alkaline substance is tertiary ammonium or quaternary ammonium substance.

More preferably, said tertiary ammonium substance is any one or more selected from a group consisting of tris (2-hydroxyethyl) amine, trioctylamine, tri-n-butylamine, trimethoxyethoxy-methoxyethyl amine.

In any of the above schemes, preferably, said sensitizing agent is a sensitizing agent sensitive to specific wavelength, for example, any one or more selected from a group consisting of 2,4-diethyl-9H-thioxanthen-9-one, 9-Anthracenemethanol, 1-(2,4-Dimethylphenyl)azo-2-naphthol and other.

In any of the above schemes, preferably, said photoresist solvent is any one or more selected from a group consisting of 1,2-propanediol monomethyl ether acetate, ethyl lactate and ethyl acetate.

The present invention also provides a imaging method of photoresist, comprising following steps:
1) coating mentioned novel negative chemically-amplified photoresist onto a corresponding substrate, to form photoresist film;
2) baking the photoresist coating obtained in step 1);
3) after baking in step 2), exposing the photoresist coating in a exposure machine;
4) after exposed in step 3), baking the photoresist film;
5) after baking in step 4), placing the photoresist film into the developer to develop.

In the above imaging method of the photoresist, preferably, in step 1), said substrate is substrate composed of any one or more selected from a group consisting of silicon, aluminum, polymer resin, silicon dioxide, doped silicon dioxide, silicon nitride, tantalum, copper, polycrystalline silicon, ceramics, aluminum \ copper mixture, gallium arsenide.

In the above imaging method of the photoresist, preferably, thickness of said photoresist coating is 0.75-1.5 μm in step 1).

In the above imaging method of the photoresist, preferably, said baking refers to that the substrate is baked at 90-110° C. for 60 s in step 2).

In the above imaging method of the photoresist, preferably, said exposure is carried out at a exposure wavelength of 248 nm or 365 nm in step 3). In the above imaging method of the photoresist, preferably, said baking refers to that the substrate is baked at 90-110° C. for 60 s in step 4).

In the above imaging method of the photoresist, preferably, said developing is carried out in a concentration of 2.38% tetramethyl ammonium hydroxide (TMAH) aqueous solution for 40-60 s to develop in step 5).

The chemically-amplified negative photoresist of the present invention using the chemically-amplified technology, can improve the resolution and photospeed of the photoresist effectively, and it has lower requirements on personnel operating and production line machine, and it is more environmentally friendly. With the negative photoresist, higher resolution and photospeed, pattern with straighter line edge can be obtained. Moreover, the chemically-amplified negative photoresist, for which ancillaries used is the same as that used for positive photoresists, is applicable in fields of manufacture of top-grade integrated circuits, flat panel displays, semiconductor illumination chips and others.

EXAMPLES

Example—1

A novel negative chemically-amplified photoresist comprises 25.35 g linear phenolic resin, 1.5 g (3-nitro phenyl) diphenyl sulfonium hexafluorophosphate, 30 g melamine, 1.5 g tris (2-Hydroxyethyl) amine, 1.5 g 2,4-diethyl-9H-thioxanthen-9-one and 70 g 1,2-propanediol monomethyl ether acetate. The above substances were mixed and sufficiently stirred to dissolve them completely, then the mixture is filtered with 0.1 µm polytetrafluoroethylene microporous filtering film, and finally, the novel negative chemically-amplified photoresist is obtained.

Example—2

A novel negative chemically- amplified photoresist comprised 23.85 g linear phenolic resin, 3.0 g (3-nitro phenyl) diphenyl sulfonium hexafluorophosphate, 30 g melamine, 1.5 g tris (2-Hydroxyethyl) amine, 1.5 g 2,4-diethyl-9H-thioxanthen-9-one and 70 g 1,2-propanediol monomethyl ether acetate. The above substances were weighed and mixed, and then sufficiently stirred to dissolve them completely, then the mixture is filtered with 0.1 µm polytetrafluoroethylene microporous filtering film, and finally, the novel negative chemically-amplified photoresist is obtained.

Example—3

A novel negative chemically- amplified photoresist comprised 25.35 g poly (p-hydroxystyrene) resin, 1.5 g (3-nitro phenyl) diphenyl sulfonium hexafluorophosphate, 30 g melamine, 1.5 g tris (2-Hydroxyethyl) Amine and 70 g 1,2-propanediol monomethyl ether acetate. The above substances were weighed and mixed, and then sufficiently stirred to dissolve them completely, then the mixture is filtered with 0.1 µm polytetrafluoroethylene microporous filtering film, and finally, the novel negative chemically-amplified photoresist is obtained.

Example—4

A novel negative chemically-amplified photoresist comprised 23.85 g poly (p-hydroxystyrene) resin, 3.0 g (3-nitro phenyl) diphenyl sulfonium hexafluorophosphate, 30 g melamine, 1.5 g tris (2-Hydroxyethyl) amine and 70 g 1,2-propanediol monomethyl ether acetate. The above substances were weighed and mixed, and sufficiently stirred to dissolve them completely, then the mixture is filtered with 0.1 µm polytetrafluoroethylene microporous filtering film, and finally, the novel negative chemically-amplified photoresist is obtained.

Example—5

The novel negative chemically-amplified photoresist obtained in the above examples 1 and 2 were coated onto 6-inch bare crystal silicon wafers by spin coating (spin speedspin speed of 4000 rpm), respectively, and then the bare crystal silicon wafers were baked on a hot plate for 60 seconds at 90° C. Then, thickness of the photoresist film is measured, and the thickness is 1.0 µm.

The coated silicon wafers were then exposed in a exposure machine with a wavelength of 365 nm, then they were baked on a hot plate for 60 seconds at 110° C. after the completion of exposure. The wafers were then each developed using 2.38% TMAH (tetramethyl ammonium hydroxide) aqueous solution as a developer for 60 seconds. Then the photospeed and the resolution of the wafers are measured by CD SEM (KLA-Tencor 8250).

The novel negative chemically-amplified photoresist obtained by the above examples 3 and 4 were each coated onto a 8-inch bare crystal silicon wafer by spin coating (spin speedspin speed of 4000 rpm), respectively, and the bare crystal silicon wafers were baked on a hot plate for 60 seconds at 90° C. Then, thickness of the photoresist film is measured, and the thickness is 1.0 µm. The coated silicon wafers were then each exposed in a exposure machine with a wavelength of 248 nm, then they were baked on a hot plate for 60 seconds at 110° C. after the completion of exposure. The wafers were then each developed using the concentration of 2.38% TMAH (tetramethylammonium hydroxide) aqueous solution as a developer for 60 seconds. Then the photospeed and resolution of the wafers are measured with CD SEM (Hitachi S9220).

Test results are given in following table:

| examples | wavelength of exposure | photospeed (mJ/cm$^2$) | resolution (µm) |
| --- | --- | --- | --- |
| 1 | 365 nm | 100 | 0.5 |
| 2 | 365 nm | 45 | 0.45 |
| 3 | 248 nm | 30 | 0.18 |
| 4 | 248 nm | 20 | 0.15 |

As can be seen from the above results, the photoresist provided in present invention has faster photospeed and higher resolution at different wavelengths, and the photospeed of the photoresist can be further improved by increasing content of the photo-acid generators.

Example—6

A novel negative chemically-amplified photoresist and imaging method thereof.

A novel negative chemically-amplified photoresist comprises 23 g linear phenolic resin, 1 g (3-nitro phenyl) diphenyl sulfonium hexafluorophosphate, 28 g melamine, 1 g trioctylamine, 1 g 9-Anthracenemethanol and 65 g ethyl lactate. The above substances were weighed and mixed, and then the mixture is stirred sufficiently to dissolve them completely, and then it is filtered with 0.1 µm polytetrafluoroethylene microporous filtering film, and finally, the novel negative chemically-amplified photoresist is obtained.

An imaging method of the above-mentioned novel negative chemically-amplified photoresist, comprising following steps:
1) coating the above-mentioned novel negative chemically-amplified photoresist by spin coating (spin speedspin speed of 4000 rpm) onto a substrate with silicon dioxide, to form photoresist coating of thickness of 0.75 µm;
2) baking the photoresist coating obtained in step 1) with a hot plate for 60 seconds at 90° C.;
3) after baking in step 2), exposing the photoresist coating in a exposure machine with a wavelength of 268 nm;
4) after exposing in step 3), baking the photoresist coating with a hot plate for 60 seconds at 90° C.;

5) after baking in step 4), placing the photoresist coating into a concentration of 2.38% tetramethyl ammonium hydroxide (TMAH) aqueous solution for 40 s to develop.

Example—7

A novel negative chemically-amplified photoresist and imaging method thereof.

A novel negative chemically-amplified photoresist comprised 26 g poly (p-hydroxystyrene) resin, 4 g (3-nitro phenyl) diphenyl sulfonium hexafluorophosphate, 32 g melamine, 2 g tri-n-butylamine, 2 g 1-(2,4-Dimethylphenyl) azo-2-naphthol and 75 g ethyl acetate. The above substances were weighed and mixed, and then the mixture is stirred sufficiently to dissolve them completely, and then it is filtered with 0.1 μm polytetrafluoroethylene microporous filtering film, and finally, the novel negative chemically-amplified photoresist is obtained.

An imaging method of the above-mentioned novel negative chemically-amplified photoresist, and its steps are as follows:
1) coating the above-mentioned novel negative chemically-amplified photoresist by spin coating (spin speedspin speed of 4000 rpm) on a substrate with silicon nitride underlayment, to form photoresist coating of thickness of 1.5 μm;
2) baking the photoresist coating obtained in step 1) on a hot plate for 60 seconds at 110° C.;
3) after baking in step 2), exposing the photoresist coating was in a exposure machine with a wavelength of 268 nm;
4) after exposing in step 3), baking the photoresist coating with a hot plate for 60 seconds at 110° C.;
5) after baking in step 4), placing the photoresist coating into a concentration of 2.38% tetramethyl ammonium hydroxide (TMAH) aqueous solution for 60 s to develop.

Example—8

A novel negative chemically-amplified photoresist and imaging method thereof.

A novel negative chemically-amplified photoresist comprised 24 g mixture of poly (p-hydroxystyrene) resin and linear phenolic resin, 2 g (3-nitro phenyl) diphenyl sulfonium hexafluorophosphate, 29 g melamine, 1.2 g trimethoxyethoxy methoxyethyl amine 1-2, 1.8 g 2,4-diethyl-9H-thioxanthen-9-one and 68 g 1,2-propanediol monomethyl ether acetate. The above substances were weighed and mixed, and then the mixture is stirred sufficiently to dissolve them completely, and then it is filtered with 0.1 μm polytetrafluoroethylene microporous filtering film, and finally, the novel negative chemically-amplified photoresist is obtained.

A imaging method of the above-mentioned novel negative chemically-amplified photoresist, and its steps are as follows:
1) coating the above-mentioned novel negative chemically-amplified photoresist by spin coating (spin speed of 4000 rpm) on a substrate with polymer resin to form photoresist coating of the thickness of 1 um;
2) baking the photoresist coating obtained in step 1) with a hot plate for 60 seconds at 100° C.;
3) after baking in step 2), exposing the photoresist coating in a exposure machine with a wavelength of 365 nm;
4) after exposing in step 3), baking the photoresist coating with a hot plate for 60 seconds at 100° C.;
5) after baking in step 4), placing the photoresist coating into a concentration of 2.38% tetramethyl ammonium hydroxide (TMAH) aqueous solution for 50 s to develop.

Example—9

A novel negative chemically-amplified photoresist and imaging method thereof.

A novel negative chemically-amplified photoresist comprises 25 g linear phenolic resin, 3 g (3-nitro phenyl) diphenyl sulfonium hexafluorophosphate, 31 g melamine, 1.4 g tris (2-Hydroxyethyl) amine, 0.8 g 9-Anthracenemethanol and 72 g ethyl lactate. The above substances were weighed and mixed, and then the mixture is stirred sufficiently to dissolve them completely, and then it is filtered with 0.1 μm polytetrafluoroethylene microporous filtering film, and finally, the novel negative chemically-amplified photoresist is obtained.

A imaging method of the above-mentioned novel negative chemically-amplified photoresist, and its steps are as follows:
1) coating the above-mentioned novel negative chemically-amplified photoresist by spin coating (spin speed of 4000 rpm) on a substrate with ceramic underlayment, to form photoresist coating of the thickness of 1.2 μm;
2) baking the photoresist coating obtained in step 1) with a hot plate for 60 seconds at 105° C. ;
3) after baking in step 2), exposing the photoresist coating in a exposure machine with a wavelength of 365 nm;
4) after exposing in step 3), baking the photoresist coating with a hot plate for 60 seconds at 105° C.;
5) after baking in step 4), placing the photoresist coating into a concentration of 2.38% tetramethyl ammonium hydroxide (TMAH) aqueous solution for 55 s to develop.

Example—10

A novel negative chemically-amplified photoresist and imaging method thereof.

A novel negative chemically-amplified photoresist comprises 25.6 g poly (p-hydroxystyrene) resin, 3.5 g (3-nitro phenyl) diphenyl sulfonium hexafluorophosphate, 30.6 g melamine, 1.8 g trioctylamine, 1.3 g 1-(2,4-Dimethylphenyl) azo-2-naphthol and 74 g ethyl acetate. The above substances were weighed and mixed forming mixture, and then the mixture is stirred sufficiently to dissolve them completely, and then it is filtered with 0.1 μm polytetrafluoroethylene microporous filtering film, and finally, the novel negative chemically-amplified photoresist is obtained.

A imaging method of the above-mentioned novel negative chemically-amplified photoresist, and its steps are as follows:
1) coating the above-mentioned novel negative chemically-amplified photoresist by spin coating (spin speed of 4000 rpm) on a substrate with aluminum \ copper mixture underlayment, to form photoresist coating of the thickness of 1.4 μm;
2) baking the photoresist coating obtained in step 1) with a hot plate for 60 seconds at 95° C.;
3) after baking in step 2), exposing the photoresist coating in a exposure machine with a wavelength of 268 nm;
4) after exposing in step 3), baking the photoresist coating with a hot plate for 60 seconds at 95° C.;

5) after baking in step 4), placing the photoresist coating into a concentration of 2.38% tetramethyl ammonium hydroxide (TMAH) aqueous solution for 45 s to develop.

The chemically-amplified negative photoresist of the embodiments described above using the chemically-amplified technology can improve the resolution and photospeed of the photoresist effectively, and it has lower requirements for personnel operating and production line machine, and is more environmentally friendly. With the negative photoresist, higher resolution and photospeed, pattern having straighter line edge can be obtained. Moreover, the chemically-amplified negative photoresist, for which the ancillaries used is the same as that used for positive photoresists, is applicable in fields of manufacture of top-grade integrated circuits, flat panel displays, LED chips and others.

The methods and systems of the present invention are not limited to the examples described, and other embodiments obtained by those skilled in the art according to the technical aspect of the present invention also belong to scope of the present invention of technological innovation.

We claim:

1. A novel negative chemically-amplified photoresist comprising a phenol resin, a photo-acid generator, a cross-linking agent, an alkaline additive, a sensitizing agent and a photoresist solvent; wherein:(a) said sensitizing agent is at least one member selected from the group consisting of 2,4-diethyl-9H-thioxanthen-9-one, 9-Anthracenemethanol and 1-(2,4-Dimethylphenyl) azo-2-naphthol, (b) said cross-linking agent can undergo a condensation reaction with a phenolic hydroxyl group or an ortho-/ para-hydroxymethyl functional group, and (c) a mass ratio of said phenol resin, photo-acid generator, cross-linking agent, alkaline additive, sensitizing agent and photoresist solvent is 23-26: 1-4: 28-32: 1-2: 1.5-2: 65-75.

2. The novel negative chemically-amplified photoresist according to claim 1, wherein the mass ratio of said phenol resin, photo-acid generator, cross-linking agent, alkaline additive, sensitizing agent and photoresist solvent is 25.35: 1.5: 30: 1.5: 1.5: 70.

3. The novel negative chemically-amplified photoresist according to claim 1, wherein said phenol resin is linear polymer material obtained by condensation polymerization of phenolic polymers or phenolic polymer with aldehydes.

4. The novel negative chemically-amplified photoresist according to claim 1, wherein said phenol resin is poly(p-hydroxystyrene) resin and/or linear phenolic resin.

5. The novel negative chemically-amplified photoresist according to claim 1, wherein said photoacid generator is at least one member selected from the group consisting of iodonium salts, sulfonium salts and heterocyclic acid generators; general formulas of said iodonium salts, sulfonium salts and heterocyclic acid generators are respectively following (1), (2), (3):

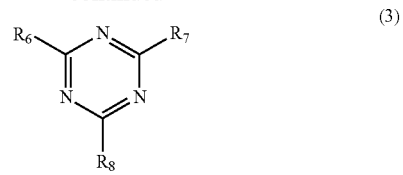

wherein $R_1$, $R_2$, $R_3$, $R_4$, $R_5$, $R_6$, $R_7$ and $R_8$ are hydrocarbons ($C_nH_{n+1}$, n=1-6), or benzene and benzene derivatives, or hydrocarbons containing halogen; X, Y are any one of non-nucleophilic anion selected from a group consisting of $BF_4^-$, $ClO_4^-$, $PF_6^-$, $AsF_6^-$ and $SbF_6^-$.

6. The novel negative chemically-amplified photoresist according to claim 1, wherein said cross-linking agent is a heterocyclic compound containing an ether bond.

7. The novel negative chemically-amplified photoresist according to claim 6, wherein said ether bond connects to carbon hydrocarbon chain of 1-6 carbon atoms, and/or hydrocarbons containing halogen, and/or benzene and benzene derivatives.

8. The novel negative chemically-amplified photoresist according to claim 1, wherein said alkaline additive is organic alkaline substance.

9. The novel negative chemically-amplified photoresist according to claim 8, wherein said organic alkaline substance is a tertiary amine or a quaternary ammonium substance.

10. The novel negative chemically-amplified photoresist according to claim 9, wherein said tertiary amine is at least one member selected from the group consisting of tris (2-Hydroxyethyl) amine, trioctylamine, tri-n-butylamine and tris(2-(methoxymethoxy)ethyl)amine.

11. The novel negative chemically-amplified photoresist according to claim 1, wherein said photoresist solvent is at least one member selected from the group consisting of 1,2-propanediol monomethyl ether acetate, ethyl lactate and ethyl acetate.

12. A photoresist imaging method, comprising the following steps of:
1) coating said novel negative chemically-amplified photoresist of claim 1 onto a substrate, to form a photoresist coating;
2) baking the photoresist coating obtained in step 1);
3) after baking in step 2), exposing the photoresist coating;
4) after exposing in step 3), baking the photoresist coating; and
5) after baking in step 4), placing the photoresist coating into a developer to develop.

13. The photoresist imaging method according to claim 12, wherein said substrate in step 1) is an underlayment substrate composed of at least one member selected from the group consisting of silicon, aluminum, polymer resin, silicon dioxide, doped silicon dioxide, silicon nitride, tantalum, copper, polycrystalline silicon, ceramics, aluminum\copper mixture, and gallium arsenide.

14. The photoresist imaging method according to claim 12, wherein a thickness of said photoresist coating is 1.0 μm in step 1).

15. The photoresist imaging method according to claim 12, wherein said photoresist coating is baked at 90° C. for 60 s in step 2).

16. The photoresist imaging method according to claim 12, wherein said exposing is carried out at an exposure wavelength of 248 nm or 365 nm in step 3).

17. The photoresist imaging method according to claim 12, wherein said photoresist coating is baked at 110° C. for 60 s in step 4).

18. The photoresist imaging method according to claim 12, wherein said developing is carried out in a concentration of 2.38% tetramethyl ammonium hydroxide (TMAH) aqueous solution for 40-60 s to develop in step 5).

* * * * *